(12) United States Patent
Jansen et al.

(10) Patent No.: US 7,876,086 B2
(45) Date of Patent: Jan. 25, 2011

(54) CURRENT MEASURING DEVICE FOR MEASURING THE ELECTRICAL CURRENT FLOWING IN AN ELECTRICAL CONDUCTOR ELECTRICALLY ISOLATED FROM THE CURRENT MEASURING DEVICE

(75) Inventors: Arian M. Jansen, Lake Forest, CA (US); Huian Dong, Irvine, CA (US)

(73) Assignee: International Components Corporation, Westchester, IL (US)

( * ) Notice: Subject to any disclaimer, the term of this patent is extended or adjusted under 35 U.S.C. 154(b) by 0 days.

(21) Appl. No.: 12/039,312

(22) Filed: Feb. 28, 2008

(65) Prior Publication Data

US 2009/0219009 A1   Sep. 3, 2009

(51) Int. Cl.
    *G01R 15/18* (2006.01)
(52) U.S. Cl. .................................. 324/127; 324/117 R
(58) Field of Classification Search ........................ None
    See application file for complete search history.

(56) References Cited

U.S. PATENT DOCUMENTS

| | | | | |
|---|---|---|---|---|
| 5,223,789 | A * | 6/1993 | Katsuyama et al. | 324/127 |
| 5,293,121 | A * | 3/1994 | Estes, Jr. | 324/117 R |
| 6,160,697 | A * | 12/2000 | Edel | 361/143 |
| 6,456,059 | B1 * | 9/2002 | Blakely | 324/127 |
| 6,583,994 | B2 * | 6/2003 | Clayton et al. | 363/21.18 |
| 7,309,980 | B2 | 12/2007 | Mende et al. | |
| 2003/0011362 | A1 | 1/2003 | Gohlsch et al. | |
| 2003/0090356 | A1 | 5/2003 | Saito et al. | |
| 2007/0205778 | A1 | 9/2007 | Fabbro et al. | |
| 2007/0210787 | A1 | 9/2007 | Ebenezer et al. | |
| 2007/0252577 | A1 | 11/2007 | Preusse | |
| 2007/0257663 | A1 | 11/2007 | Mende et al. | |
| 2007/0290695 | A1 | 12/2007 | Mahon | |

* cited by examiner

*Primary Examiner*—Vinh P Nguyen
(74) *Attorney, Agent, or Firm*—John S. Paniaguas; Katten Muchin Rosenman LLP (57) ABSTRACT

A current measurement device is configured to measure electrical current in a primary conductor that is electrically insulated from the current measuring device. The current measuring device includes a transformer with a saturable magnetic core formed with a central aperture and a current measuring circuit. The electrical conductor in which electrical current is to be measured is disposed in the central aperture of the magnetic core. The current measuring circuit includes a current source driven by a voltage ramp generator that is connected to the secondary winding in a direction opposite the flow of electrical current in the primary conductor. When the magnetic flux in the transformer core is equal and opposite the magnetic flux generated as a result of the electrical current flowing in the primary conductor, the voltage of the voltage ramp generator is representative of the DC or AC electrical current flowing in the primary conductor.

17 Claims, 8 Drawing Sheets

CURRENT MEASURING DEVICE FOR MEASURING THE ELECTRICAL CURRENT FLOWING IN AN ELECTRICAL CONDUCTOR ELECTRICALLY ISOLATED FROM THE CURRENT MEASURING DEVICE

BACKGROUND OF THE INVENTION

1. Field of the Invention

The present invention relates to a current measurement device and more particularly to a current measurement device that is configured to measure electrical current, both AC and DC, in a primary conductor that is electrically insulated from the current measuring device.

2. Description of the Prior Art

Various current measuring devices are known. The simplest current measurement devices are ammeters, which are in-line devices that are connected in series with the electrical conductor in which current is to be measured. Resistors are also known in-line devices used for measuring current in an electrical conductor. The resistors are connected in series with the electrical conductor in which electrical current is to be measured. The voltage across the resistor is measured. As is well known in the art, the electrical current in the conductor is equal to V/R, where V is the voltage across the resistor in volts and R is the value of the resistor in ohms. In this case, since the voltage and the resistance is known, the electrical current can easily be determined.

In certain applications, it is necessary to measure the electrical current in an electrical conductor without the ability to connect a current measuring device in series with the electrical conductor in which the current is to be measured. For example, "donut" type current transformers (CT) are used to measure the electrical current in high voltage transformer bushings. Such CTs of a single secondary winding with an air core configured in a donut shape. These donut CTs are normally disposed so that each transformer bushing is disposed within the hole of the donut. Since the magnetic flux of the AC electrical current through the bushing, i.e. primary current, is constantly changing an electromotive force (emf) is induced across the secondary winding in accordance with Faraday's law. This emf results in an electrical current in the secondary winding that is a function of the magnitude of the primary current in the bushing and the inductance of the secondary winding. As such, the output current of the donut CTs is proportional to the primary current in the transformer bushings and thus can be used for control and instrumentation. For example, such donut CTs are normally used to drive overcurrent protection circuits and also for display and metering of the transformer output current.

Applications also exist that require measurement of the electrical current of an electrical conductor carrying DC current. In such applications, current measuring devices, such as an ammeter or electrical resistor can be wired in series with the electrical conductor in order to measure the electrical current flowing therethrough.

In other known applications, electrical current in an electrical conductor needs to be measured in which the current measuring device is electrically isolated from the electrical conductor in which the electrical current is to be measured. In such DC applications, the DC current and therefore the magnetic flux generated in a winding or coil will be constant. Unlike AC applications, there will be no induced emf in a coil as a result of DC primary current flow, as discussed above. As such, other means have been developed to measure DC electrical current in an electrical conductor with a current measuring device which is electrically isolated from the electrical conductor. One such method is disclosed in U.S. Pat. No. 7,309,980 ("the '980 patent").

The '980 patent discloses a current measuring device for measuring both DC and AC electrical current in a primary electrical conductor that is electrically isolated from the current measuring device. The current measuring device includes a transformer having a magnetic core 12 and a secondary winding 18. A Hall effect device 28 is disposed to be responsive to magnetic flux in the magnetic core 12. One end of the secondary winding 18 is connected to ground. The other end of the secondary winding is connected to an inverting input of a transimpedance amplifier 20. The output from the Hall effect device 28 is amplified by way of an amplifier 32 whose output is connected to the non-inverting input of the transimpedance amplifier 20. In this application, the core 12 of the transformer is disposed around an electrically isolated primary conductor 14. DC electrical current in the electrically isolated electrical conductor generates an electrical flux, albeit constant flux. This flux is sensed by the Hall effect device 28, which, in response thereto, generates an electrical voltage proportional to the flux. This voltage is amplified by the amplifier 32 and applied to the non-inverting input of the transimpedance amplifier 20. This voltage causes a change in the output voltage of the transimpedance amplifier 20. This change in the output voltage of the transimpedance amplifier 20 causes current to flow in the secondary winding 18 that is opposite and equal to the electrical current flowing in the primary conductor 14. Accordingly, the output voltage of the transimpedance amplifier 20 is proportional to the electrical current, both DC and AC, flowing in the primary conductor 14.

Although the current measuring device disclosed in the '980 patent is able to measure DC and AC electrical current in an electrical conductor that is isolated from it, there are various problems with such a device. First, Hall effect devices are not linear. As such, the accuracy of current measuring devices incorporating such Hall effect devices is far from ideal. Secondly, such Hall effect devices are relatively expensive, resulting in a relatively high cost for current measuring devices employing such Hall effect devices.

Thus, there is a need for a current measuring device for measuring both DC and AC electrical current in electrically isolated conductors that is relatively more accurate and less expensive than current measuring devices incorporating Hall effect devices.

SUMMARY OF THE INVENTION

Briefly, the present invention relates to a current measurement device that is configured to measure the momentary electrical current in a primary conductor that is electrically insulated from the current measuring device. Unlike known current measuring devices, the current measuring device in accordance with the present invention does not utilize a Hall effect device and is more accurate and less expensive than current measuring devices employing such Hall effect devices. The current measuring device in accordance with the present invention includes a transformer with a saturable magnetic core formed with a central aperture and a current measuring circuit. In one embodiment of the invention, the transformer is provided with a secondary winding and no primary winding. The electrical conductor, i.e. primary conductor, in which electrical current is to be measured is disposed in the central aperture of the magnetic core and thus acts as a primary winding having a single turn. The current measuring device includes a current source that is connected to the secondary winding of the transformer in a direction opposite the flow of electrical current in the primary conductor. The current source is driven by a voltage ramp generator. When the magnetic flux in the transformer core generated by way of the secondary winding is equal and opposite the magnetic flux generated as a result of the electrical current flowing in the primary conductor, the voltage of the voltage ramp generator at that point provides a signal representative of the DC or AC electrical current flowing in the primary conductor.

DESCRIPTION OF THE DRAWING

These and other advantages of the present invention will be readily understood with reference to the following specification and attached drawing wherein.

DETAILED DESCRIPTION

The present invention relates to a current measurement device that is configured to measure the momentary electrical current in a primary conductor that is electrically insulated from the current measuring device. Unlike known current measuring devices, the current measuring device in accordance with the present invention does not utilize a Hall effect device and is more accurate and less expensive than current measuring devices employing such Hall effect devices. The current measuring device in accordance with the present invention includes a transformer with a saturable magnetic core formed with a central aperture and a current measuring circuit. In one embodiment of the invention, the transformer is provided with a secondary winding and no primary winding. The electrical conductor, i.e. primary conductor, in which electrical current is to be measured is disposed in the central aperture of the magnetic core and thus acts as a primary winding having a single turn. The current measuring device includes a current source that is connected to the secondary winding of the transformer in a direction opposite the flow of electrical current in the primary conductor. As will be discussed in more detail below, the current source is driven by a voltage ramp generator. When the magnetic flux in the transformer core generated by way of the secondary winding is equal and opposite the magnetic flux generated as a result of the electrical current flowing in the primary conductor, the voltage of the voltage ramp generator at that point provides a signal representative of the DC or AC electrical current flowing in the primary conductor.

Figure 1A:
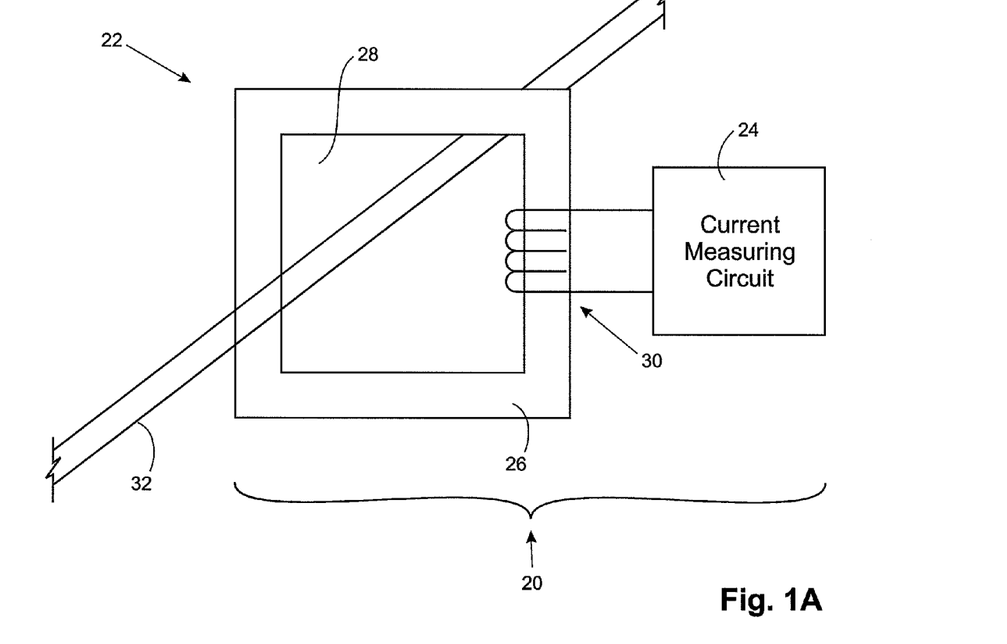
FIG. 1A is block diagram of one embodiment of a current measuring device in accordance with the present invention.
Figure 1B:
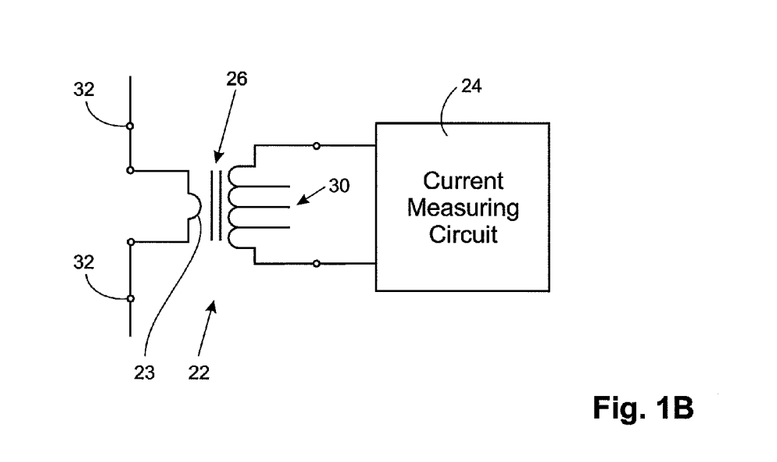
FIG. 1B is block diagram of an alternate embodiment of the current measuring device in accordance with the present invention.

Referring first to FIG. 1, the current measuring device, generally identified with the reference numeral 20, includes a transformer 22 and a current measuring circuit 24. The transformer 22 may include a saturable magnetic core 26 with a central aperture 28 and a single secondary winding 30. In one embodiment of the invention, a primary conductor 32 is disposed in the central aperture. In such an application, the primary conductor 32 is electrically isolated from the current measuring device 20 and also functions as a one turn primary winding for the transformer 22. In alternate embodiments of the invention, for example, as shown in FIG. 1B, the transformer 22 may include an actual primary winding 23, for example, a single turn, that is wound around the saturable magnetic core 26, for example, a high permeability magnetic material in addition to a secondary winding 30. In such an application, the primary conductor in which the electrical current is to be measured is connected directly to the primary winding.

Two exemplary embodiments of the current measuring circuit are illustrated. Both embodiments include a voltage controlled current source that is directly coupled to the secondary winding in a manner to generate a magnetic flux in the magnetic core 26 that is equal and opposite the magnetic flux in the magnetic core generated by the flow of electrical current in the primary conductor 32. In both embodiments, when the magnetic flux generated by the electrical current in the secondary winding is equal and opposite the magnetic flux generated by the current flowing in the primary conductor, the voltage across the secondary winding 30 will peak. The voltage applied to the voltage controlled current source at the time that the voltage across the secondary winding 30 peaks is a signal representative of the electrical current in the primary conductor 32.

Both embodiments of the invention incorporate a transformer, a voltage controlled current source and a peak detector. A first embodiment of the invention, illustrated in FIG. 2 includes a voltage ramp generator for driving the voltage controlled current source and a sample and hold circuit. A second embodiment illustrated in FIG. 3 performs essentially the same functions but replaces the sample and hold circuit and the voltage ramp generator with a microprocessor.

Figure 2:
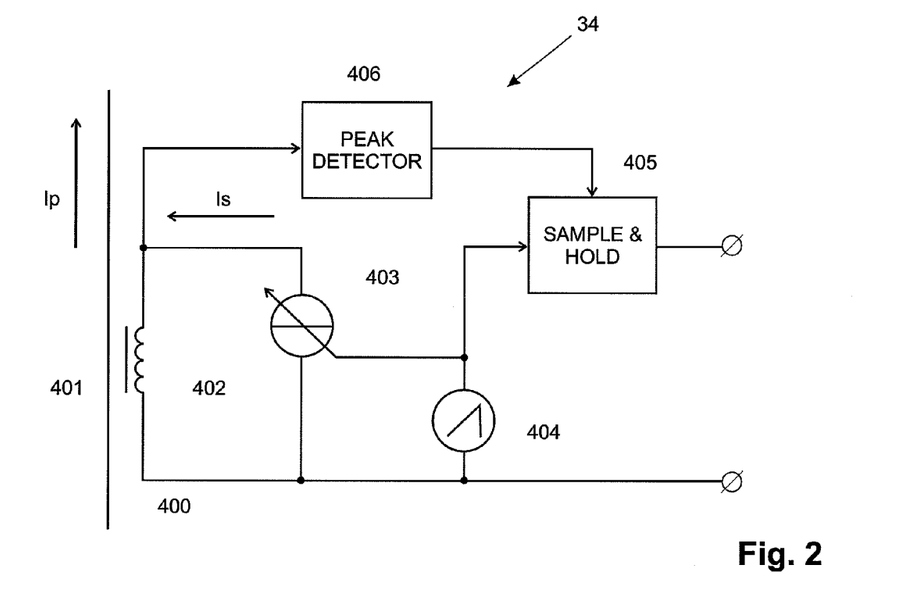
FIG. 2 is a block diagram of one embodiment of the current measuring device illustrated in FIG. 1.
Figure 3A:
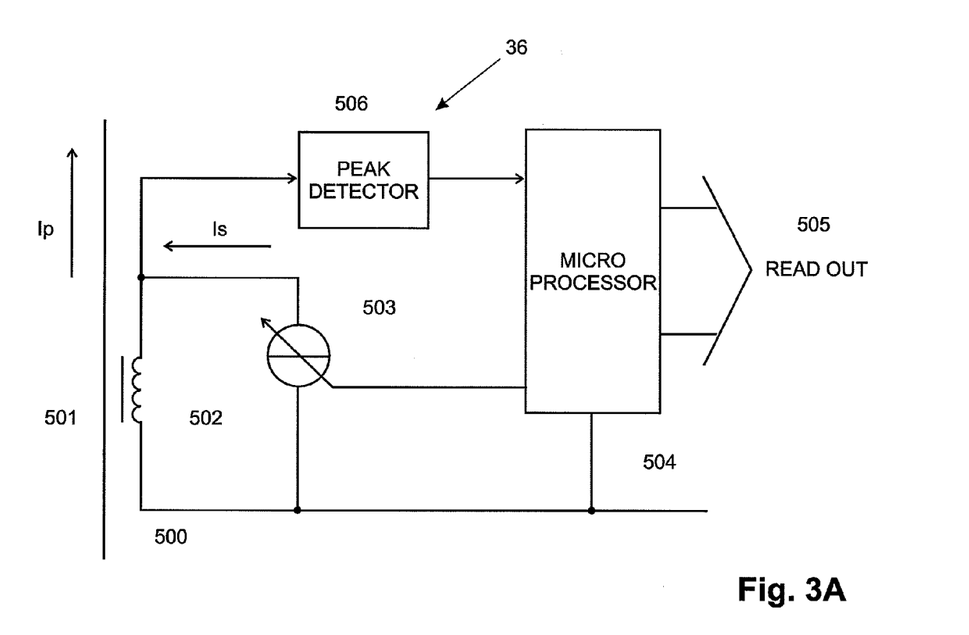
FIG. 3A is a block diagram of an alternative embodiment of the current measuring device illustrated in FIG. 1.

Referring first to FIG. 2, the current measuring device, generally identified with the reference numeral 34, includes a transformer 400 having a secondary winding 402, a voltage controlled current source 403, a sample and hold circuit 405 and a peak detector 406. The current to be measured flows through the primary side of said transformer 400, e.g. in the primary conductor 401, which may be electrically isolated from the current measuring device 34, as shown. In this embodiment, the voltage ramp generator 404 drives the voltage controlled current source 403. The current ramp from the voltage controlled current source 403 flows through the secondary winding 402 of the transformer 400 in such a manner that the magnetic flux generated in the magnetic core 26 (FIG. 1) as a result of the current in the secondary winding 402

(FIG. 2) is in a direction opposite the flux in the magnetic core 26 (FIG. 1) resulting from electrical current flowing in the primary conductor 401 (FIG. 2).

The primary current through the primary conductor 401 (FIG. 2) generates magnetic flux that saturates the magnetic core 26 (FIG. 1) resulting in relatively low inductance of the primary conductor 401 (FIG. 2) or primary winding (not shown) During such a condition, the inductance of the secondary winding 402 (FIG. 2) is relatively low. The voltage ramp generator generates a voltage ramp 601 (FIG. 4A) which drives the voltage controlled current source 403 (FIG. 2). The voltage ramp 601 (FIG. 4A) causes the voltage controlled current source 402 to generate a current ramp 602.

Figure 4A:
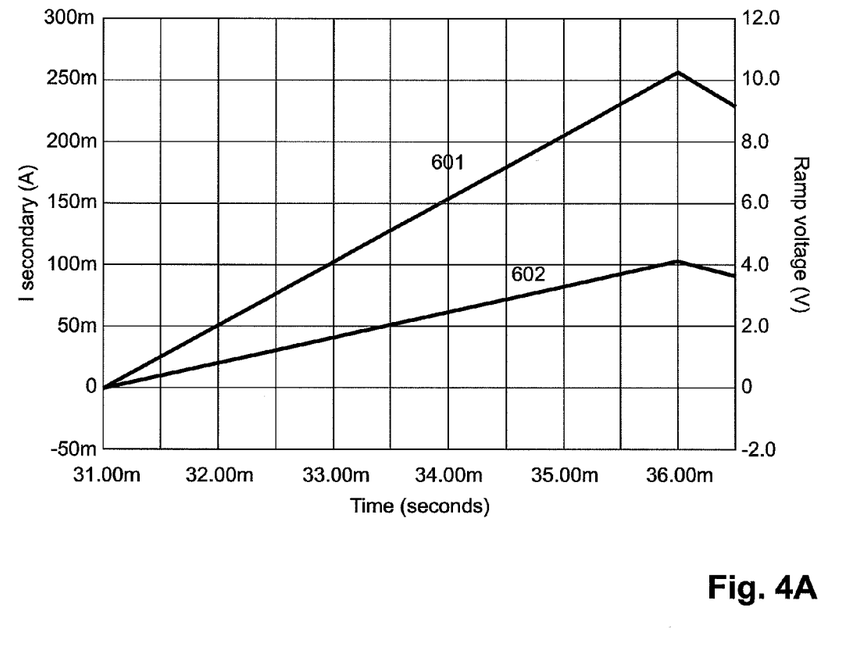
FIG. 4A illustrates an exemplary output voltage of a voltage ramp generator (404) and an exemplary output current of a voltage controlled current source in accordance with the present invention.

The voltage ramp 601 and the current ramp 602 are illustrated in FIG. 4A as being linear. However, the principles of the invention are not so limited. In particular, the principles of the invention are also applicable to current measuring devices 24 in which the voltage and current waveforms are not linear.

The current ramp 602 flows through the secondary winding 402 as $I_S$ and causes magnetic flux to be generated in the magnetic core 26 (FIG. 1) that is opposite in direction or polarity to the magnetic flux generated in the magnetic core as a result of electrical current $I_P$ flowing in the primary conductor 401 (FIG. 2) When the momentary magnetic flux as a result of the electrical current $I_S$ through the secondary winding 402 is opposite in polarity and substantially equal in amplitude to the magnetic flux as a result of the electrical current $I_P$ through the primary conductor 401 or winding, the magnetic core 26 (FIG. 1) will no longer be saturated and the inductance of the secondary winding 402 (FIG. 2) will increase substantially. Consequently, the voltage across the secondary winding 402 as a result of the current ramp will momentarily increase.

More particularly, when the flux in the magnetic core 26 (FIG. 1), resulting from the electrical current $I_P$ in the primary conductor 401 (FIG. 2) is substantially equal to the reverse flux resulting from the electrical current $I_S$ in the secondary winding 402, the resultant flux in the magnetic core 26 (FIG. 1) will become substantially zero and the magnetic core 26 will no longer be saturated. Consequently the inductances of the primary conductor or winding 401 (FIG. 2) and secondary winding 402 will increase significantly. When the secondary current $I_S$ further increases due to the current ramp, the magnetic core 26 (FIG. 1) will again saturate and the inductances of the primary conductor 401 (FIG. 2) and secondary winding 402 will drop again. The voltage across secondary winding 402, V402, is a function of the inductance of the secondary winding 402, L402, and the rate of rise (dI/dt) of the current ramp generated by the voltage controlled current source 403. The relationship is given by Equation 1

$$V402 = L402(dI/dt) \tag{1}$$

When the core goes out of saturation, the inductance L402 of the secondary winding 402 will increase drastically as will the voltage V402 across the secondary winding 402 according to equation 1. The peak detector 406 is used to detect the peak voltage V402 across the secondary winding 402. The peak voltage is used to trigger a sample and hold circuit 405 that is responsive to the voltage of the voltage ramp generator 404. The sample and hold circuit 405 samples the voltage of the voltage ramp generator 404 at the moment that the flux in the core of the transformer (400) was substantially zero, i.e. when the peak voltage is detected. This momentary voltage in the voltage ramp generator 404 has a substantially linear relation to the electrical current $I_P$ in the primary conductor 401 to be measured.

Figure 4B:
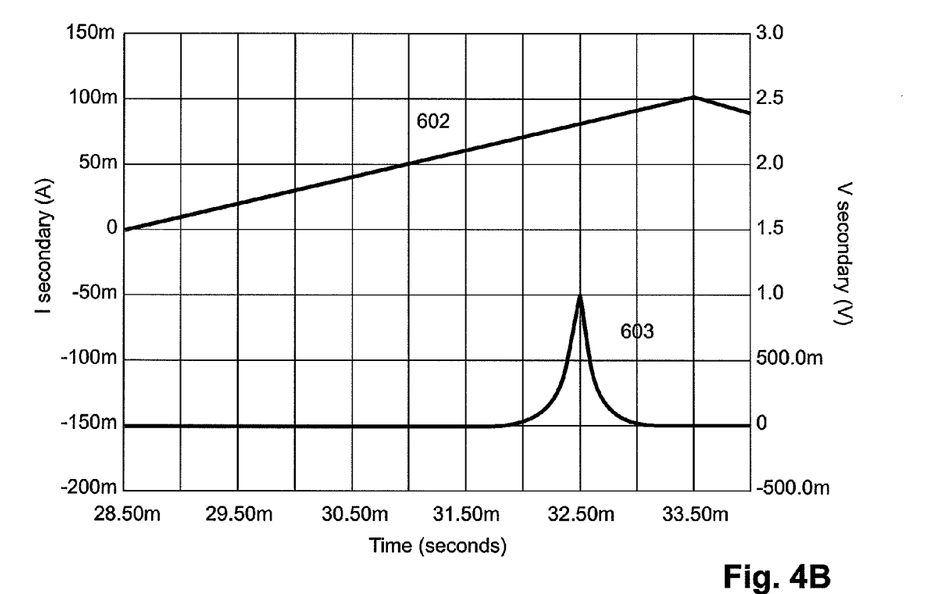
FIG. 4B illustrates an exemplary output current of the voltage controlled current source and an exemplary voltage across the secondary winding for an exemplary primary current $I_P$ of 8 A.
Figure 4C:
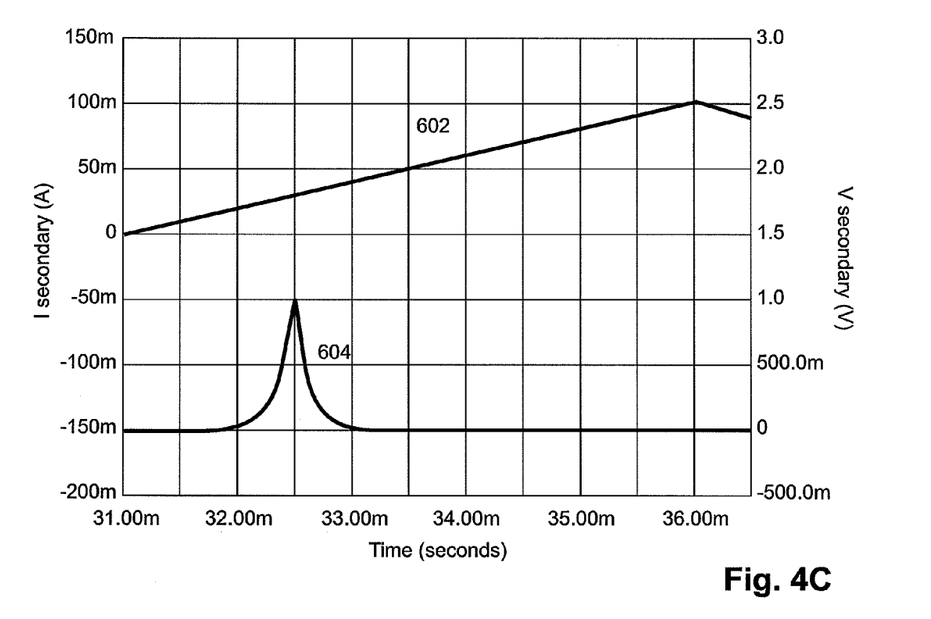
FIG. 4C is similar to FIG. 4B, but with an exemplary primary current $I_P$ of 3 A.

FIGS. 4A-4E illustrate the various waveforms and signals associated with the embodiment of the invention illustrated in FIG. 2. In particular, FIG. 4B illustrates the voltage 603 across the secondary winding 402 (FIG. 2) as a function of time for an exemplary primary current $I_P$ of 8.0 amps DC. FIG. 4B is similar but for an exemplary primary current $I_P$ of 3.0 amps DC. The voltage waveforms 603 and 604 are in response to a current ramp 602 being applied to the secondary winding 402.

Figure 4D:
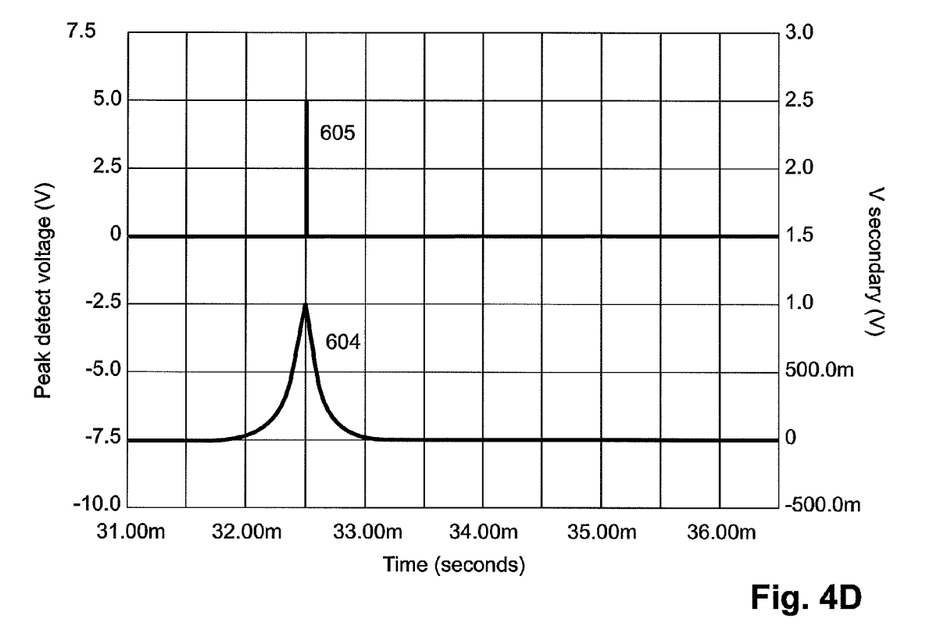
FIG. 4D illustrates an exemplary voltage across the secondary winding and an exemplary output signal of a peak detector with an exemplary primary current $I_P$ of 3 A in accordance with the present invention.
Figure 4E:
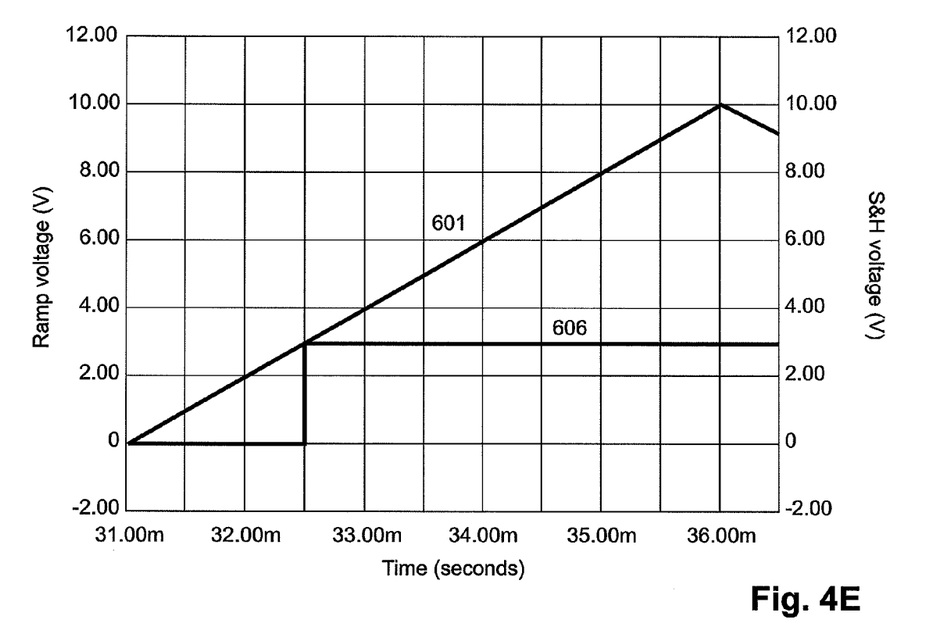
FIG. 4E illustrates an exemplary output voltage of the voltage ramp generator and an exemplary output voltage of a sample and hold circuit with an exemplary primary current $I_P$ of 3 A in accordance with the present invention.

FIG. 4D illustrates the output signal 605 of the peak detector 406 (FIG. 2) in response to a primary current $I_P$ of 3.0 amps DC and the current ramp 602 (FIG. 4C) being applied to the secondary winding 402 (FIG. 2). FIG. 4E illustrates the output voltage 601 of the voltage ramp generator 404. FIG. 4E also illustrates the output voltage of the sample and hold circuit 405 (FIG. 2) for the peak detection signal as illustrated in FIG. 4D. As shown, the peak detection voltage is 3.o volts which corresponds in magnitude to a 3.0 amp DC primary current $I_P$.

The following assumptions apply to the characteristics of the components in the current measuring device, illustrated in FIG. 2. with respect to the waveforms illustrated in FIGS. 4A-4E.

| | |
|---|---|
| Measuring range for $I_P$: | 0-10 A |
| Measurement ratio of the entire circuit: | 1 V/A |
| Voltage ramp rate of generator 404: | 2 V/ms |
| Amplitude of generator 404: | 0-10 V |
| Transconductance of voltage controlled current source 403: | 10 mA/V |
| Turns (Npr) of primary winding 401: | 1 |
| Turns (Nsec) of secondary winding 402: | 100 |
| Primary saturation current (Isat): | <100 mA |

Figure 3B:
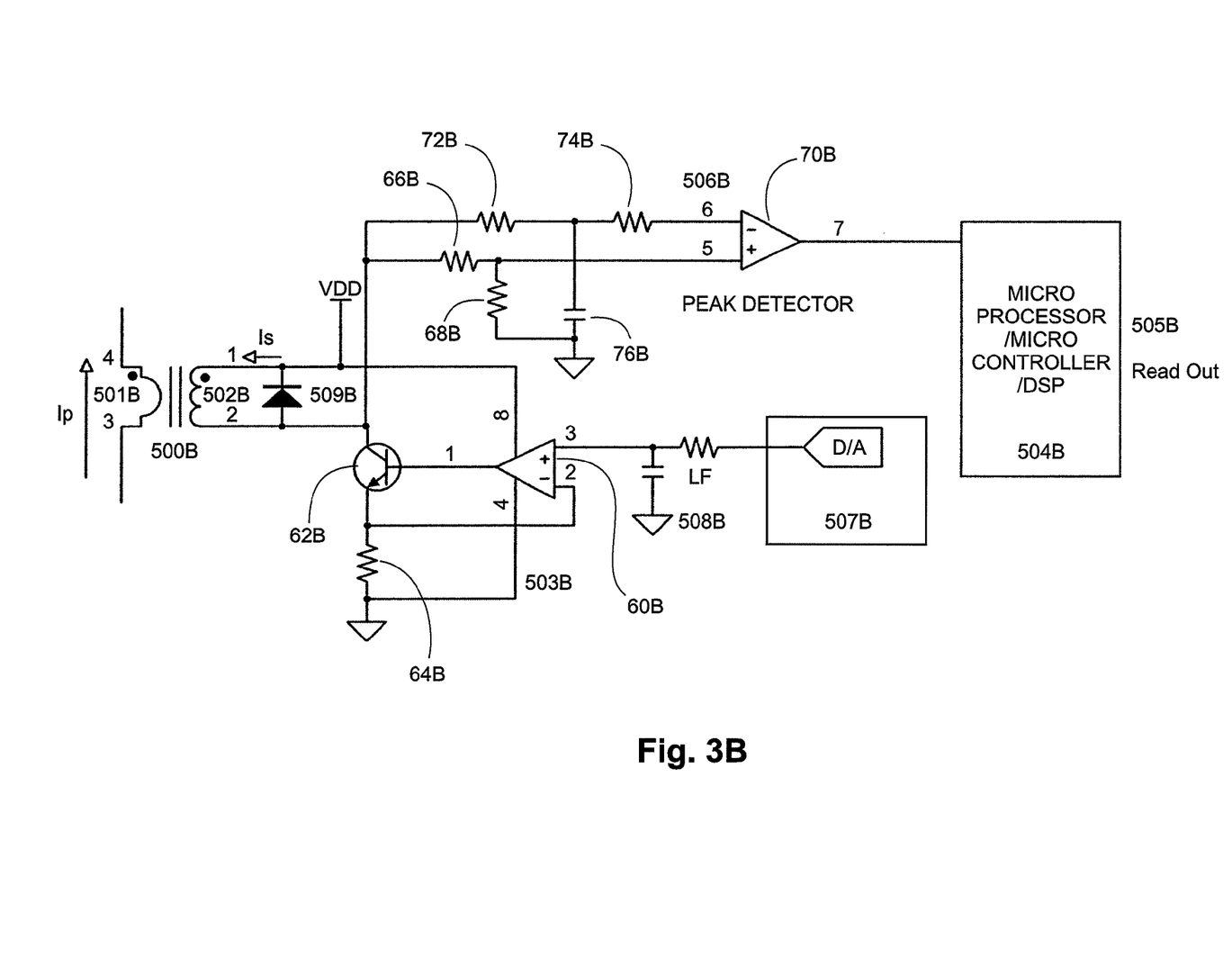
FIG. 3B is an electrical schematic diagram of an embodiment of the current measuring device illustrated in FIG. 3A.

An alternate embodiment of the current measuring device 24 is illustrated in FIG. 3A. The principles of operation are identical to those of the first embodiment of the invention as shown in FIG. 2. In the alternate embodiment, the voltage ramp generator 404 and the sample and hold circuit 405 are replaced by a microprocessor, microcontroller or digital signal processor 504 ("hereinafter referred to as "processor 504"). In this embodiment, the processor 504 generates a digital ramp which is converted into an analog voltage ramp by standard digital to analog (D/A) conversion techniques, for example, by a D/A converter, either on board with the microcontroller or a separate D/A converter, as shown in FIG. 3B. The analog voltage ramp is connected to the voltage controlled current source 503. The processor 504 monitors the output of a peak detector 506. When a peak is detected, the processor 504 derives the value of the current to be measured $I_P$ by means of the momentary value of the digital ramp and any applicable scaling factors and provides the information in a digital read out format 505.

Figure 3C:
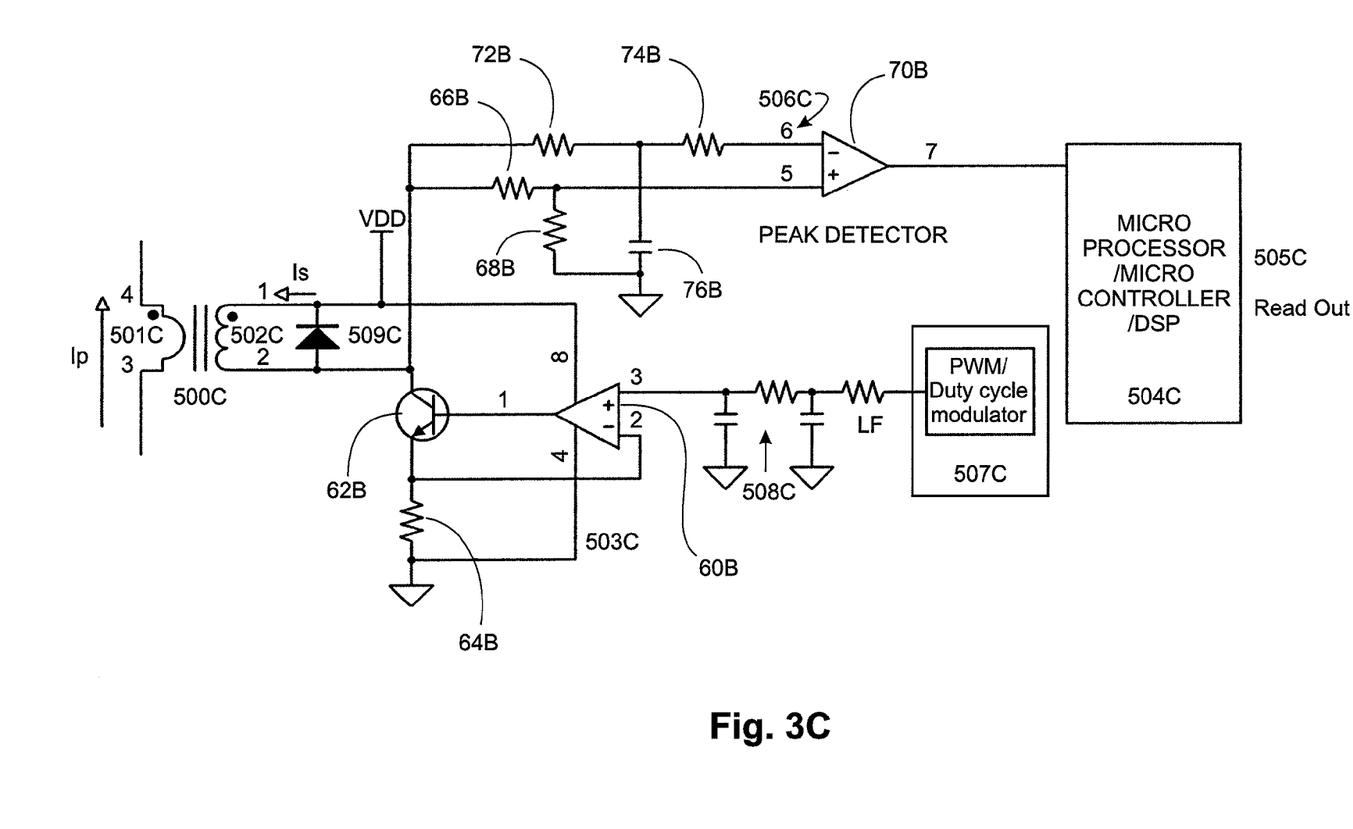
FIG. 3C is an electrical schematic diagram of an alternative embodiment of the current measuring device illustrated in FIG. 3A.

Exemplary embodiments of the current measuring device 24 are illustrated in FIGS. 3B and 3C. The main difference between the circuit illustrated in FIG. 3B and FIG. 3C relates to the components and method used to generate the voltage ramp 601 (FIG. 4A). In FIG. 3B, a D/A converter 507B is used to generate the voltage ramp 601 (FIG. 4A) under the control of the processor 504B. In FIG. 3C, a pulse width modulator (PWM) circuit, which may be on-board with the processor 504B, along with a low pass filter 508C, may be used to generate the voltage ramp 601.

Referring first to FIG. 3B, the current measuring device 24 includes a processor 504B, a D/A converter 507B, a low pass filter 508B, a voltage controlled current source 503B and a peak detector 506B. The processor 504B generates digital voltage values and applies those values to the D/A converter 507B, which converts the digital voltage values to corresponding analog voltages. These analog voltages are filtered by a low pass filter 508B, which integrates the analog voltages values with respect to time to provide a voltage ramp. The output of the low pass filter 508B is applied to the voltage controlled current source 503B.

The exemplary voltage controlled current source 503B includes a differential amplifier 60B, a transistor 62B, for example, a bipolar junction transistor, and a current sourcing resistor 64B. The analog voltage from the output of the low pass filter 508B is applied to a non-inverting input of the differential amplifier 60B and compared with the emitter voltage $V_E$ of the transistor 62B. Initially when the transistor 62B is off, the emitter voltage $V_E$ is zero. Once the output voltage of the differential amplifier 60B exceeds the turn on voltage of the transistor 62B, the transistor 60B turns on and electrical current $I_S$ flows in the direction indicated by the arrow through the secondary winding 502B of the transformer 500B, the transistor 62B, and the current sourcing resistor 64B and back to the positive polarity end of the secondary winding 502B, as indicated by the dot. When the current flows through the secondary winding 502B of the transformer 500B, a voltage drop occurs across the current sourcing resistor 64B. As the voltage increases at the output of the low pass filter 508B, the voltage drop across the current sourcing resistor 64B increases causing a proportional increase in the amount of current flowing through the secondary winding 502B. More particularly, an increased voltage across the current sourcing resistor 64B, the secondary current $I_S$ will increase by an amount proportional to the change in voltage $\Delta V$.

As mentioned above, the current flowing in the secondary winding $I_S$ flows in a direction that is opposite in polarity relative to the current $I_P$ flowing in the primary conductor 32 (FIG. 1). In particular, as illustrated in FIG. 3B, the primary current $I_P$ flows in a direction that is represented as flowing away from the polarity dot on the primary side. The secondary current $I_S$ flows in a direction into the polarity dot on the secondary winding 502B. As such, the magnetic flux $\phi_P$ generated in the transformer core 22 (FIG. 1) as a result of electrical current, i.e. primary current $I_P$ flowing in the electrical conductor 32 will be opposite in polarity relative to the magnetic flux $\phi_S$ generated in the transformer core 22 as a result of the electrical current $I_S$ flowing in the secondary winding 502B (FIG. 3B) of the transformer 500B. As further discussed above, when the magnitude of the magnetic flux $\phi_P$ is equal in magnitude to the magnetic flux $\phi_S$, the voltage drop across the secondary winding 502B of the transformer 500B peaks. This voltage peak is sensed by the peak detector circuit 506B.

The peak detector 506B illustrated in FIG. 3B is merely exemplary and is connected to an end of the secondary winding 502B, opposite the polarity dot, as shown. A pair of voltage divider resistors 66B and 68B are connected between the secondary winding 502B of the transformer 500B and a non-inverting input of a operational amplifier 70B. The voltage across the secondary winding 502B of the transformer 500B is applied to the non-inverting input of the operational amplifier 70B, configured as a differential amplifier. The voltage across the secondary winding 502B of the transformer 500B is also applied to the non-inverting input of the operational amplifier 70B by way of a pair of voltage divider resistors 72B and 74B and a capacitor 76B. The capacitor 76B is thus constantly being charged to the voltage across the secondary winding 502B. As mentioned above, when a primary current $I_P$ initially flows in the primary conductor 32 (FIG. 1), the magnetic core 26 saturates, at which point the inductance of the secondary winding 502B will be relatively low. Since the voltage across the secondary winding 502B is proportional to the inductance, the voltage across the secondary winding 502B will be virtually zero due to saturation of the magnetic core 26, as indicated by the waveform 604 (FIG. 4D) During such time, the peak detector 506B (FIG. 3B) will be comparing two virtually equal and zero voltages. Thus, the output of the peak detector 506B will be zero during this time, as indicated by the waveform 605 (FIG. 4D). As the magnitude of the magnetic flux $\phi_S$ approaches the magnetic flux $\phi_P$, the magnetic core 26 (FIG. 1) comes out of saturation causing the inductance of the secondary winding 502B to rise. The rise in the inductance of the secondary winding 502B causes the voltage across the secondary to rise to a peak value where the magnetic flux $\phi_S$ becomes equal to the magnetic flux $\phi_P$. The capacitor 76B prevents the voltage applied to the inverting input of the differential amplifier 70B from immediately charging up to the maximum voltage across the secondary winding 502B. As such at the time the voltage across the secondary winding 502B rises to the peak value, as indicated by the waveform 604 (FIG. 4D), the voltage applied to the inverting input of the differential amplifier will remain at the level prior to the transformer core 26 (FIG. 1) coming out of saturation, i.e. at or near zero volts. As such, when the voltage across the secondary winding 506B (FIG. 3B) peaks, as indicated by the waveform 604 (FIG. 4D), the peak detector 506B (FIG. 3B) will generate a voltage spike at its output, as indicated by the waveform 605 (FIG. 4D). The output of the peak detector 506B (FIG. 3B) is monitored by the processor 504B. When the processor 504B senses the voltage spike at the output of the peak detector 506B, the processor determines the voltage along the voltage ramp 601 (FIG. 4E) at which point the voltage spike occurred in the peak detector 506B. As indicated by the waveform 606 (FIG. 4E), and as discussed above, this value is representative of the current flowing in the electrical conductor 32 (FIG. 1).

A diode 509B is connected across the secondary winding 502B. The diode 509B is used to protect the circuit from a high voltage spike when the voltage ramp and thus the current in the secondary winding is switched off. As discussed above, the voltage across the secondary winding 502B is proportional to the inductance L and the rate of change of current through the secondary winding 502B with respect to time. Since an abrupt can cause a relatively high voltage drop across the secondary winding 502B, the diode 509B provides a current path for the secondary current $I_S$ from the secondary winding 502B and into the cathode of the diode 509B and back to the secondary winding 502B.

As indicated by the waveform 601 (FIG. 4E), if the voltage applied to the voltage controlled current source 503B (FIG. 3B) is allowed to continue to increase after the voltage across the secondary winding 502B peaks, the magnetic core will saturate again due to the increased secondary current $I_S$ being applied to the secondary winding 502B causing the inductance as well as the voltage of the secondary winding 502B to decrease as indicated by the waveform 604 (FIG. 4D). The decrease in voltage of the secondary winding 502B (FIG. 3B) results in discharge of the capacitor 76B. The increasing magnetic flux $\phi_S$, due to the increasing current $I_S$ applied to the secondary winding 502B causes the transformer core to saturate in a reverse direction, causing the inductance of the secondary winding to drop to a relatively low level. The low level of inductance causes the voltage across the secondary winding to drop to around zero. As the voltage across the secondary winding 502B decreases, the capacitor 76B discharges causing the peak detector 506B output to go to zero volts, as indicated by the waveform 605 (FIG. 4D).

As shown in FIG. 4D, the voltage across the secondary winding peaks momentarily and returns to zero volts. It is to be understood that the waveform 604 illustrated in FIG. 4D is in response to a voltage ramp waveform 601 (FIG. 4E) that continues to increase after the voltage across the secondary winding 502B (FIG. 3B) peaks. Other waveforms are possible depending on the voltage waveform applied to the voltage controlled current source 503B. For example, rather than a momentary peak of the voltage across the secondary winding 502B, voltage waveforms can be generated and applied to the voltage controlled current source 503B that result in voltages across the secondary winding 502B that dwell on a maximum value. In other words, voltage waveforms can be generated and applied to the voltage controlled current source 503B that result in voltages across the secondary winding 502B that resemble a square pulse with a duty cycle>0. In addition, in some embodiments, it is contemplated that the voltage ramp will be reset to zero volts right after the determination of the current flowing in the conductor 32 (FIG. 1) More particularly, in contemplated embodiments of the invention, the ramp voltage 601 may be reset to zero or any other predetermined value after the peak detector 406, 506 has detected the peak voltage 603, 604 at the secondary winding 402, 502 of the transformer 400 500. All such configurations are considered to be within the broad scope of the invention.

Referring to FIG. 3C, the current measuring circuit 24 includes a processor 504C, a PWM circuit 507C, a low pass filter 508C, a voltage controlled current source 503C and a peak detector 506C. For brevity, only the differences between this embodiment and the embodiment illustrated in FIG. 3B above are discussed. In this embodiment, a PWM circuit 507C and a low pass filter 508C are used in place of the D/A converter 507B in FIG. 3B. In this embodiment, the pulse width of the PWM circuit 507C is varied in order to vary the current applied to the secondary winding 502C. Assuming a linear voltage ramp is desired, the pulse width from the PWM circuit is varied, for example, from a 0 duty cycle to a 100% duty cycle. The low pass filter 508C integrates the pulse width and provides an analog voltage signal at its output that is proportional to the duty cycle of the pulse from the PWM circuit 507C. The analog voltage from the low pass filter 508C is applied to an exemplary voltage controlled current source 503C which varies the current in the secondary winding 502C of the transformer 500C. as discussed above.

In this embodiment, the low pass filter 508C essentially includes two low pass filters in tandem. The first stage of the low pass filter is used to integrate the PWM output signal to generate a signal representative of the average value of the voltage for the specific duty cycle. The average value will be a constant. The average value is integrated by the second stage of the low pass filter 508C to generate a voltage ramp. As the duty cycle from the PWM circuit 507C is increased, the analog voltage at the output of the second stage of the low pass filter 508C will increase. The rest of the circuit will operate in the manner described above. Components in FIG. 3C which have an identical function as components in FIG. 3B have been assigned the same reference numbers except that the suffix has been changed from B to C.

Figure 5:
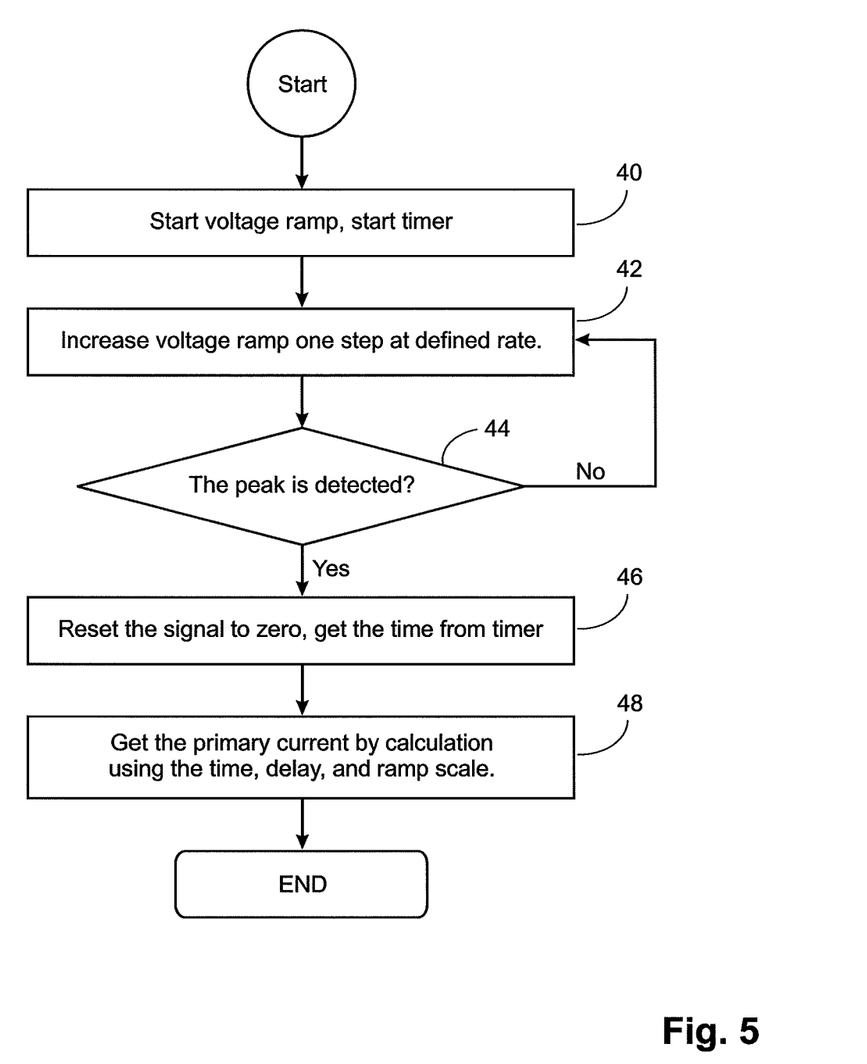
FIG. 5 is an exemplary software flow diagram for use with the present invention.

An exemplary flowchart for the microprocessor is shown in FIG. 5. Initially in step 40, the processor 504 (FIG. 3A) initiates the voltage ramp, for example, as illustrated by the waveform 601 (FIG. 4A) and starts a timer. The timer is used so that the voltage can be increased at a defined rate. Next in step 42, the ramp voltage is increased one step at the defined rate, i.e. predetermined volts per second, As discussed above, this voltage is used to drive the voltage controlled current generator 503. As illustrated in FIG. 3A, the microprocessor 504 senses the output voltage of the peak detector 506 (FIG. 3A). After the voltage is increased, the processor 504 determines in step 44 whether a peak signal is detected, such as the peak 605, illustrated in FIG. 4D. If a peak signal is not detected, the system cycles back to step 42 and increases the voltage ramp by another step and then repeats step 44. This process is repeated until a peak signal is repeated. Once a peak signal is detected, the ramp voltage 601 (FIG. 4A) is set to zero and the time from the timer that the peak voltage was detected is stored in step 46. In step 48, the primary current $I_P$ is determined using the time the peak signal was detected and the ramp scale. The processor 504 may incorporate a delay to account for the delay in the various components in the current measuring circuit 24 (FIG. 1), such as the peak detector circuit 506 (FIG. 3A).

It is to be understood that the present invention is not limited to the measurement of unidirectional DC currents. When a voltage ramp is applied that ramps form a negative value to a positive value, DC currents in both directions can be measured with the same circuit. AC currents can also be measured when the ramp voltage repetition frequency is at more than twice as high as the frequency of the AC current. In embodiments in which the electrical current in the conductor 32 (FIG. 1) is AC, the processor 504 (FIG. 3A) can calculate the peak and root mean square (RMS) AC current values using well known techniques.

Obviously, many modifications and variations of the present invention are possible in light of the above teachings. Thus, it is to be understood that, within the scope of the appended claims, the invention may be practiced otherwise than as specifically described above.

We claim:

1. A current measuring circuit for measuring the magnitude of electrical current in a primary conductor comprising:
a transformer having a secondary winding and a magnetic core formed with a central aperture for receiving said primary conductor; and
a current measuring circuit for measuring the magnitude of electrical current in said primary conductor that is electrically isolated from said current measuring device, said current measuring circuit including a voltage source and a voltage controlled current source, said voltage controlled current source being electrically coupled to said secondary winding of said transformer for varying the electrical current applied to said secondary winding as a function of the voltage applied to said voltage controlled current source, said current measuring circuit also configured to measure the voltage across said secondary winding and provide a signal representative of the magnitude of electrical current in said primary conductor when the voltage across said secondary winding reaches a peak value.

2. The current measuring circuit as recited in claim 1, wherein said voltage source includes a digital to analog converter (D/A) and a processor, said processor being configured to generate digital voltage values that are converted to analog voltage values.

3. The current measuring circuit as recited in claim 2, wherein said voltage source includes a low pass filter for integrating said analog voltage values.

4. The current measuring circuit as recited in claim 3, wherein said voltage source is configured to generate an analog voltage ramp.

5. The current measuring circuit as recited in claim 1, wherein said voltage source includes a pulse width modulation (PWM) circuit for generating pulses with variable duty cycles and a processor, said processor being configured to vary the pulse width of said pulses.

6. The current measuring circuit as recited in claim 5, further including a first low pass filter for integrating the pulse width of said pulses to determine the average value of said pulse.

7. The current measuring circuit as recited in claim 6, further including a second low pass filter for integrating the average value of said pulse.

8. The current measuring circuit as recited in claim 7, wherein said voltage source is configured to generate an analog voltage ramp.

9. The current measuring circuit as recited in claim 1, wherein the voltage controlled current source includes a transistor.

10. The current measuring circuit as recited in claim 1, wherein the voltage controlled current source includes a current sourcing resistor.

11. The current measuring circuit as recited in claim 10, wherein said current sourcing resistor is electrically coupled to said secondary winding.

12. The current measuring circuit as recited in claim 1, wherein said transformer core is formed with an aperture configured to receive an electrical conductor in which current is to be measured, said electrical conductor forming the primary winding of said transformer.

13. The current measuring circuit as recited in claim 1, wherein said current measuring circuit is configured to measure DC current.

14. The current measuring circuit as recited in claim 1, wherein said current measuring circuit is configured to measure AC current.

15. The current measuring circuit as recited in claim 14, wherein said current measuring circuit is configured to determine the RMS value of the AC current.

16. A current measuring circuit for measuring the magnitude of electrical current in an electrical conductor, the current measuring circuit comprising:
   a transformer having a primary winding and a secondary winding and a magnetic core; and
   a current measuring circuit for measuring the magnitude of electrical current in said electrical conductor, said current measuring circuit including a voltage source and a voltage controlled current source, said voltage controlled current source being electrically coupled to said secondary winding of said transformer for varying the electrical current applied to said secondary winding as a function of the voltage applied to said voltage controlled current source, said current measuring circuit also configured to measure the voltage across said secondary winding and provide a signal representative of the magnitude of electrical current flowing in said electrical conductor when the voltage across said secondary winding reaches a peak value, wherein said electrical conductor in which the current is to be measured is serially coupled to said primary winding.

17. A method for measuring an electrical current in an electrical conductor, the method comprising the steps of
   (a) disposing a magnetic core around an electrical conductor in which current is to be measured.
   (b) providing an electrical current in a secondary winding provided on said magnetic core of a magnitude and polarity sufficient to generate magnetic flux in said magnetic core to cancel the magnetic flux in said core generated by the electrical current in said electrical conductor;
   (c) measuring the voltage across the secondary winding: and
   (d) providing an indication of the current in said electrical conductor when a peak value of the voltage across the secondary winding is detected.

* * * * *